April 26, 1960 W. D. LEWIS 2,934,658

MICROWAVE SWITCHING CIRCUITS

Filed Oct. 31, 1956

INVENTOR
W. D. LEWIS
BY Alan C. Rose
ATTORNEY

United States Patent Office 2,934,658

Patented Apr. 26, 1960

2,934,658

MICROWAVE SWITCHING CIRCUITS

Willard D. Lewis, Mendham, N.J., assignor to Bell Telephone Laboratories, Incorporated, New York, N.Y., a corporation of New York Application October 31, 1956, Serial No. 619,434

11 Claims. (Cl. 307—88.5)

Figure 1:
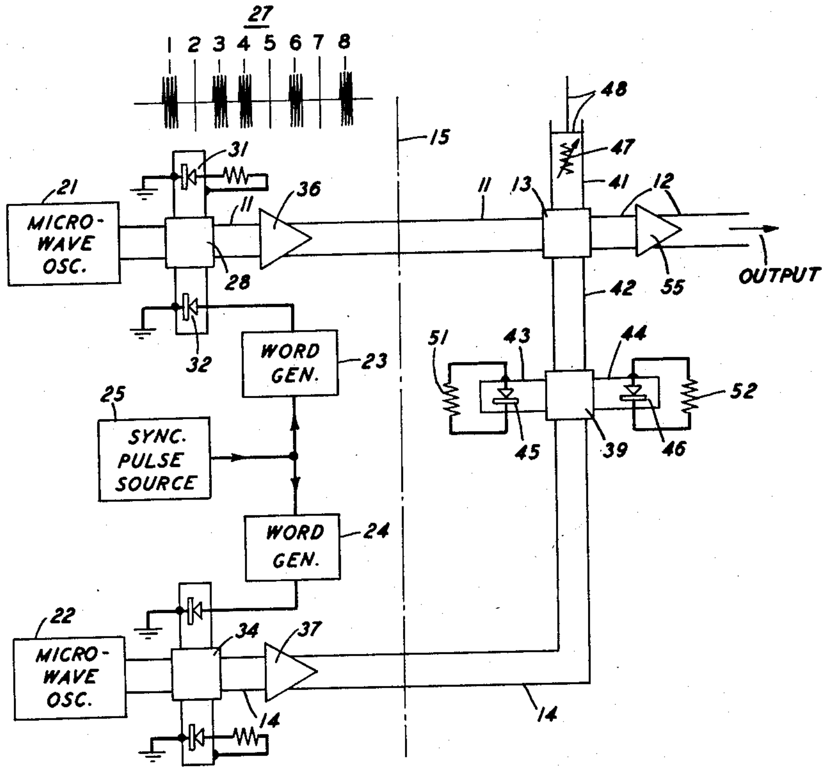

This invention relates to microwave switching or logic circuits and has for its principal object the improvement and simplification of such circuits.

As disclosed in W. M. Goodall application Serial No. 619,435, filed October 31, 1956, and entitled "Microwave Data Processing Circuits," now Patent 2,914,249, issued November 24, 1959, microwave switching circuits may be instrumented by the use of control diodes which may be energized by detectors connected to other points in the microwave circuit. The change of impedance of the diodes permits switching from one branch output circuit to another.

In accordance with the present invention, the control diodes coupled to microwave switching circuits may be energized directly by microwave control signals, and these control signals may be isolated from the remainder of the microwave circuit by a balanced hybrid junction arrangement. Thus, the microwave switch assumes one state when the impedance of the control diodes is changed by the presence of control signals, and assumes another state in the absence of control signals.

In one specific embodiment of the invention, a first hybrid junction having first and second pairs of conjugate arms has input and output wave guides connected to the first pair of arms. Microwave energy applied to the input wave guide divides equally between the two additional wave guides connected to the second pair of conjugate arms of the hybrid junction. In accordance with the relative impedances of these two additional wave guides, energy is either reflected back to the input wave guide or is transmitted to the output wave guide of the hybrid junction. The relative impedance of the second pair of arms of the first hybrid junction is controlled by varying the impedance of diodes in a second hybrid junction connected to one of the two arms. Coupled to the other arm of the second pair is an impedance which matches that of the second hybrid junction when its associated diodes are in one impedance state. The second hybrid junction also has four branch arms, one of which is connected to the first hybrid, as noted above. The control diodes are located respectively in wave guide stubs connected to a pair of conjugate arms of the second hybrid junction. Now, when microwave control energy is applied to the fourth arm of the second hybrid, the impedance state of the diodes is changed by self-bias resulting from rectification, and the first hybrid junction is unbalanced. This permits signal transmission from the input to the output wave guides of the first hybrid. The diodes in the second hybrid are identical and are symmetrically positioned with respect to the branch arm of the hybrid junction to which the microwave control signals are applied so that they are not coupled to the first hybrid junction.

One advantage of the present invention is its applicability to logic circuits such as AND units. Thus, for example, when input microwave pulses are applied to only one of the two hybrid circuits in the wave guide arrangements described in the preceding paragraph, no output signal is produced. However, when both the first and second hybrid circuits are energized by microwave input signals, an output signal is produced.

It is a feature of the invention that two diodes are located respectively in the arms of one pair of conjugate arms of a hybrid junction, and that an impedance-sensitive microwave component and a source of control signals are connected respectively to the other two conjugate arms of the hybrid junction.

Figure 2:
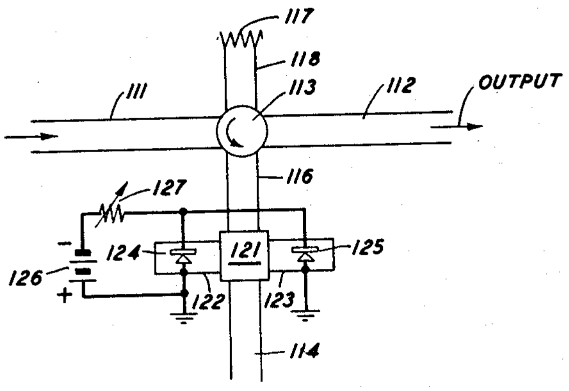

Other objects, advantages, and features of the invention will be apparent from a consideration of the following detailed description taken in conjunction with the accompanying drawing, in which:

Fig. 1 is a microwave switching circuit in accordance with the principles of the invention; and Fig. 2 is an alternative version of the circuit of Fig. 1.

With reference to the drawing, Fig. 1 shows, by way of example, a microwave switching circuit and the associated pulse generation circuitry. From an over-all standpoint, the circuit of Fig. 1 controls the transmission of microwave signals from wave guide 11 to the output wave guide 12. Under normal conditions, signals applied to wave guide 11 are blocked at the hybrid junction 13. However, when signals are also present on the control input wave guide 14, the microwave circuitry is switched to permit transmission of signals from wave guide 11 to the output wave guide 12.

Turning to a consideration of the detailed circuitry required to accomplish the function described above, the pulse generation circuits will be reviewed first. In Fig. 1, the pulse generation circuitry appears to the left of the vertical dash-dot line 15, while the logic circuit with which we are primarily concerned appears to the right of the line 15. The pulse generation circuitry includes the microwave oscillators 21 and 22, the word generation circuits 23 and 24, and the synchronizing pulse source 25. The microwave oscillators 21 and 22 may, for example, be klystron oscillators, and may have output frequencies of approximately five kilomegacycles. The pulse trains produced by the pulse generation circuits of Fig. 1 have a relatively high pulse repetition rate. For example, the repetition rate of the digits represented by the modulated pulses shown at 27 associated with the wave guide 11 may range from 50,000,000 to over 100,000,000 digits per second.

In serial binary computing apparatus, numbers are characteristically represented by a series of pulses. In general, a series of time slots is established, and binary signals are represented by the presence or absence of pulses in successive time slots. The presence of a pulse in a particular time slot or digit period may correspond to the binary symbol "1," and the absence of a pulse may correspond to the binary symbol "0." The pulses representing a single number or code group appear in a group of consecutive digit periods which is normally designated a "word period."

Referring to Fig. 1, it has been noted that the modulated pulse pattern 27 is present in wave guide 11. The pulse pattern 27 represents an eight-digit "word" corresponding to the binary code group 10110101. The correspondence between the pulse pattern 27 and the binary number indicated above may be noted from the presence in the pulse train 27 of pulses in digit periods 1, 3, 4, 6, and 8.

The synchronizing pulse source 25 applies pulses to the word generators 23 and 24 concurrently. The word generators 23 and 24 may, for example, include a tapped delay line through which the synchronizing pulses are transmitted. Diode switching circuits connected to taps along the delay line may have their outputs connected in parallel. In accordance with the enabling or disabling of the successive switching circuits connected to the taps of the delay lines, pulses appear in successive digit periods. Thus, for example, the output from the word generator 23 required to produce the pulse train 27 would have the appearance of the rectified envelope of the pulse train 27. A synchronized train of direct current pulses is produced by the word generator 24. The pulse train from the word generator 24 also depends on the pattern of a group of switching circuits such as those mentioned above, and will normally be different from that which appears at the output of word generator 23.

The direct current pulses from the word generator 23 are impressed on microwave signals from the oscillator 21 in hybrid junction 28. The hybrid junction 28 may, for example, be a "magic T" wave guide structure such as that shown in Fig. 12.4–7 on page 643 of a text entitled "Principles and Applications of Waveguide Transmission" by George C. Southworth, D. Van Nostrand Co., Inc., New York, 1950, or in C. C. Cutler Patent 2,652,541 granted September 15, 1953. The hybrid junction may also take the form described in an article entitled "Directional Couplers" by W. W. Mumford, Proceedings of the I.R.E., February 1947 at page 160. Other known hybrid junctions may also be employed.

The diodes 31 and 32 are located in the two arms of one pair of conjugate arms of the hybrid junction 28. When no bias is applied to the diodes 31 and 32, microwave energy from the oscillator 21 is reflected equally and in phase from the two diodes, and no microwave energy is coupled to the wave guide 11. However, when pulses from the word generator 23 are applied to the diode 32, its impedance state is changed with respect to that of diode 31, and a pulse of microwave energy is applied to wave guide 11. Accordingly, the train of microwave pulses 27 corresponds to the direct current pulses at the output of the word generator 23. Similarly, microwave pulse signals are applied to wave guide 14 in accordance with signals applied to the hybrid junction 34 from the word generator 24. The microwave pulses in wave guides 11 and 14 are amplified by the amplifiers 36 and 37 which may, for example, be traveling wave tubes. Traveling wave tubes and similar broad-band amplifiers which employ the drift time of electrons to obtain amplification are required to properly amplify the microwave pulses.

The switching circuit per se (to the right of the dashed line 15) includes the hybrid junctions 13 and 39. The microwave energy in the signals applied to the hybrid junction 13 from the wave guide 11 divides equally between wave guide arms 41 and 42. Energy applied to hybrid junction 39 from wave guide 42 is in turn divided equally between the wave guide stubs 43 and 44 associated with hybrid junction 39. The asymmetrically conducting devices 45 and 46 are located in the wave guide stubs 43 and 44, respectively. Accordingly, the impedance of the wave guide 42 as seen from hybrid junction 13 depends on the impedance states of diodes 45 and 46.

The wave guide 41 associated with hybrid junction 13 is provided with a variable attenuation element 47 and an adjustable plunger 48. The impedance of wave guide 41 is adjusted by varying the resistive element 47 and the position of the plunger 48 so that it is exactly equal to the impedance presented by wave guide 42 in the absence of microwave signals on wave guide 14. With these impedance conditions, microwave energy is reflected from wave guides 41 and 42 with the same magnitude and phase, and is therefore reflected back toward wave guide 11 in accordance with the known properties of hybrid junctions.

When microwave signals are applied to hybrid junction 39 from wave guide 14, however, the diodes 45 and 46 rectify the applied microwave energy and tend to bias themselves in the high resistance state. The bias is developed across resistors 51 and 52 associated with diodes 45 and 46, respectively. When diodes 45 and 46 are in the high resistance state, microwave energy is transmitted past them more freely, and more energy is reflected back from the ends of wave guide stubs 43 and 44 than when the diodes are unbiased. Accordingly, the hybrid junction 13 is unbalanced, with appreciably more energy being reflected back from wave guide 42 than from wave guide 41. Microwave energy from wave guide 11 is therefore transmitted through hybrid junction 13 to the output wave guide 12. The signal strength of the output pulse may, of course, be increased by the use of a suitable amplifier 55.

The impedance of the wave guide stub 41 may also be adjusted to match that presented at wave guide 42 when signals are applied to diodes 45 and 46 from the wave guide 14. Under these conditions, the signals on wave guide 11 will normally be transmitted through hybrid junction 13, and are only blocked when a signal is also present on wave guide 14. With this arrangement, the switching circuit of Fig. 1 becomes an inhlibit unit with inhibiting signals being presented on wave guide 14.

It is again noted that the diodes 45 and 46 are identical, and are located in wave guide arms 43 and 44 symmetrically with respect to the wave guide 14. With this arrangement, signals from wave guide 14 are always reflected back from wave guide arms 43 and 44 in phase, and with equal signal levels. Therefore, no microwave energy from wave guide 14 is coupled to the wave guide 42 or to the output wave guide 12.

The circuit of Fig. 2 performs much the same function as that of Fig. 1. In Fig. 2, the wave guides 111 and 114 correspond generally to the input wave guides 11 and 14 of Fig. 1, and the output wave guide 112 in Fig. 2 corresponds to the output wave guide 12 of Fig. 1. The pulse generation circuitry required for supplying microwave pulses to the input wave guides 111 and 114 is identical with that shown in Fig. 1, and therefore is not reproduced.

The principal difference between the circuit of Fig. 2 and that of Fig. 1 is the use of the circulator 113 as the principal wave guide switching element instead of the hybrid 13 of Fig. 1. A circulator is a nonreciprocal device which couples electrical signals to successive output terminals. Thus, for example, microwave energy applied to the circulator 113 from wave guide 111 is coupled to the wave guide 116. Microwave energy which may be reflected back from wave guide 116 toward circulator 113 is coupled to the output wave guide 112. Similarly, any energy directed toward the circulator 113 from wave guide 112 would be dissipated in the resistive termination 117 associated with the stub 118. This coupling of energy to successive terminals of an electrical circuit is, of course, contrary to the normal reciprocal mode of operation expected of passive wave guide components. The nonreciprocal properties of circulators are normally obtained by the use of magnetized nonconducting material such as the bimetallic ferrites. One typical circulator structure is disclosed in the application of W. M. Goodall cited above.

Considering the mode of operation of the circuits associated with circulator 113 is detail, the energy from input wave guide 111 is applied to the hybrid junction 121 by the wave guide 116. In the hybrid junction 121, microwave energy is divided, with half being applied to each of wave guide stubs 122 and 123. The control diodes 124 and 125 are located in the wave guide stubs 122 and 123, respectively. The diodes are normally biased to the proper low resistance state required to absorb low level microwave signals by biasing circuits including voltage source 126 and a variable resistor 127. Accordingly, the microwave signals applied to wave guide 116 from the input wave guide 111 are normally absorbed by the wave guide stubs 122 and 123. However, when a strong microwave signal is applied to the hybrid junction 121 on lead 114 concurrently with microwave signals from the input wave guide 111, there is a considerable increase in the amount of microwave energy applied to the diodes 124 and 125. Under these circumstances, the diodes 124 and 125 rectify a considerable amount of microwave energy and tend to bias themselves in the reverse current direction, overcoming the effect of the biasing voltage 126. With diodes 124 and 125 in a higher impedance state, a considerable fraction of the microwave energy applied from circulator 113 to hybrid junction 121 is reflected back to the circulator 113. This reflected energy from wave guide 116 is coupled to the output wave guide 112 by the circulator 113. Accordingly, the circuit of Fig. 2 constitues a logical AND gate in which signals are coupled to the output wave guide 112 only when signals appear at input wave guide 111 and at input wave guide 114.

It is to be understood that the above-described arrangements are illustrative of the application of the principles of the invention. Numerous other arrangements may be devised by those skilled in the art without departing from the spirit and scope of the invention.

What is claimed is:

1. A microwave circuit comprising a wave guide switching component having an input wave guide, an output wave guide, and a control wave guide, means for applying binary signals in microwave pulse form to said input wave guide, a hybrid junction having four arms, a first arm of said junction being coupled to said control wave guide, means for applying microwave control pulses to the arm of said hybrid junction which is conjugate with respect to said first arm, and two asymmetrically conducting devices coupled respectively to the other two arms of said hybrid junction.

2. A combination as defined in claim 1 wherein said wave guide switching component is a circulator.

3. A combination as defined in claim 1 wherein said wave guide switching component is a hybrid junction.

4. A microwave circuit comprising a wave guide switching component having an input wave guide, an output wave guide, and a control wave guide, a first pulse generator for applying a train of pulses to said input wave guide, a hybrid junction having a first arm coupled to said control wave guide, a second pulse generator for applying a different train of pulses to the arm of said hybrid junction which is conjugate with respect to said first arm, and two asymmetrically conducting devices coupled respectively to the other two arms of said hybrid junction.

5. A microwave circuit comprising a wave guide switching component having an input wave guide, an output wave guide, and a control wave guide, a first pulse generator for applying a train of pulses to said input wave guide, a hybrid junction having a first arm coupled to said control wave guide, a second pulse generator for applying a different train of pulses to the arm of said hybrid junction which is conjugate with respect to said first arm, two asymmetrically conducting devices coupled respectively to the other two arms of said hybrid junction, and means for precisely synchronizing the individual pulses which appear concurrently in said two different trains of pulses.

6. A microwave circuit comprising a wave guide component having an input wave guide and a control wave guide, means for applying binary signals in microwave pulse form to said input wave guide, a hybrid junction having a first arm coupled to said control wave guide, means for applying microwave control pulses to the arm of said hybrid junction which is conjugate with respect to said first arm, and two asymmetrically conducting devices coupled respectively to the other two arms of said hybrid junction.

7. In combination, a hybrid junction having first and second pairs of conjugate arms, two asymmetrically conducting devices coupled to the two arms of said first pair of arms, a source of control signals coupled to one of the arms of said second pair, and microwave component means coupled to the other arm of said second pair of arms for comparing the impedance presented to it by said hybrid junction with a reference value of impedance.

8. In combination, a hybrid junction having first and second pairs of conjugate arms, two asymmetrically conducting devices coupled to the two arms of said first pair of arms, a source of control signals coupled to one of the arms of said second pair, and microwave switching means coupled to the other arm of said second pair of arms, said switching means including means responsive to the impedance presented to it by said hybrid junction for changing the state of said switching means.

9. In combination, a first hybrid junction having first and second pairs of conjugate arms, input and output wave guides coupled respectively to said first pair of conjugate arms, a second hybrid junction having one arm coupled to one of the arms of said second pair of arms of said first hybrid junction, two diodes coupled respectively to a conjugate pair of arms of said second hybrid junction, said diodes being symmetrically located with respect to said hybrid junction, and a source of control microwave signals coupled to the remaining arm of said second hybrid junction.

10. A combination as defined in claim 9 wherein variable impedance means for balancing the impedance presented by said second hybrid junction is coupled to the other arm of said second pair of conjugate arms of said first hybrid junction.

11. A microwave circuit comprising a branching wave guide component having an input wave guide, an output wave guide, and a control wave guide, means for applying binary signals in microwave pulse form to said input wave guide, a hybrid junction having four arms, a first arm of said junction being coupled to said control wave guide, means for applying microwave control pulses to the arm of said hybrid junction which is conjugate with respect to said first arm, and two variable impedance elements coupled respectively to the other two arms of said hybrid junction.

References Cited in the file of this patent

UNITED STATES PATENTS

| | | |
|---|---|---|
| 2,593,113 | Cutler | Apr. 15, 1952 |
| 2,735,933 | Pierce | Feb. 21, 1956 |